(12) United States Patent
Wehrly, Jr. et al.

(10) Patent No.: US 7,259,452 B2
(45) Date of Patent: Aug. 21, 2007

(54) LEADED PACKAGE INTEGRATED CIRCUIT STACKING

(75) Inventors: James Douglas Wehrly, Jr., Austin, TX (US); David Roper, Austin, TX (US)

(73) Assignee: Staktek Group L.P., Austin, TX (US)

( * ) Notice: Subject to any disclaimer, the term of this patent is extended or adjusted under 35 U.S.C. 154(b) by 0 days.

(21) Appl. No.: 11/248,662

(22) Filed: Oct. 11, 2005

(65) Prior Publication Data

US 2007/0080470 A1  Apr. 12, 2007

(51) Int. Cl.
*H01L 23/02* (2006.01)

(52) U.S. Cl. .................. 257/686; 257/685; 257/690; 257/E23.06

(58) Field of Classification Search .............. 257/685, 257/690, E23.06, 686
See application file for complete search history.

(56) References Cited

U.S. PATENT DOCUMENTS

| | | | |
|---|---|---|---|
| 6,313,998 B1 * | 11/2001 | Kledzik et al. | 361/767 |
| 6,572,387 B2 * | 6/2003 | Burns et al. | 439/69 |
| 6,608,763 B1 * | 8/2003 | Burns et al. | 361/790 |
| 2006/0050592 A1 * | 3/2006 | Cady et al. | 365/230.03 |

* cited by examiner

*Primary Examiner*—Jerome Jackson
*Assistant Examiner*—Mohammad Timor Karimy
(74) *Attorney, Agent, or Firm*—Fish & Richardson P.C.; J. Scott Denko

(57) ABSTRACT

A system and method for electrically and thermally coupling adjacent IC packages to one another in a stacked configuration is provided. A flex circuit is inserted in part between ICs to be stacked and provides a connective field that provides plural contact areas that connect to respective leads of the ICs. Thus, the flex does not require discrete leads which must be individually aligned with the individual leads of the constituent ICs employed in the stack. The principle may be employed to aggregate two or more contact areas for respective connection to leads of constituent ICs but is most profitably employed with a continuous connective field that provides contact areas for many leads of the ICs.

33 Claims, 18 Drawing Sheets

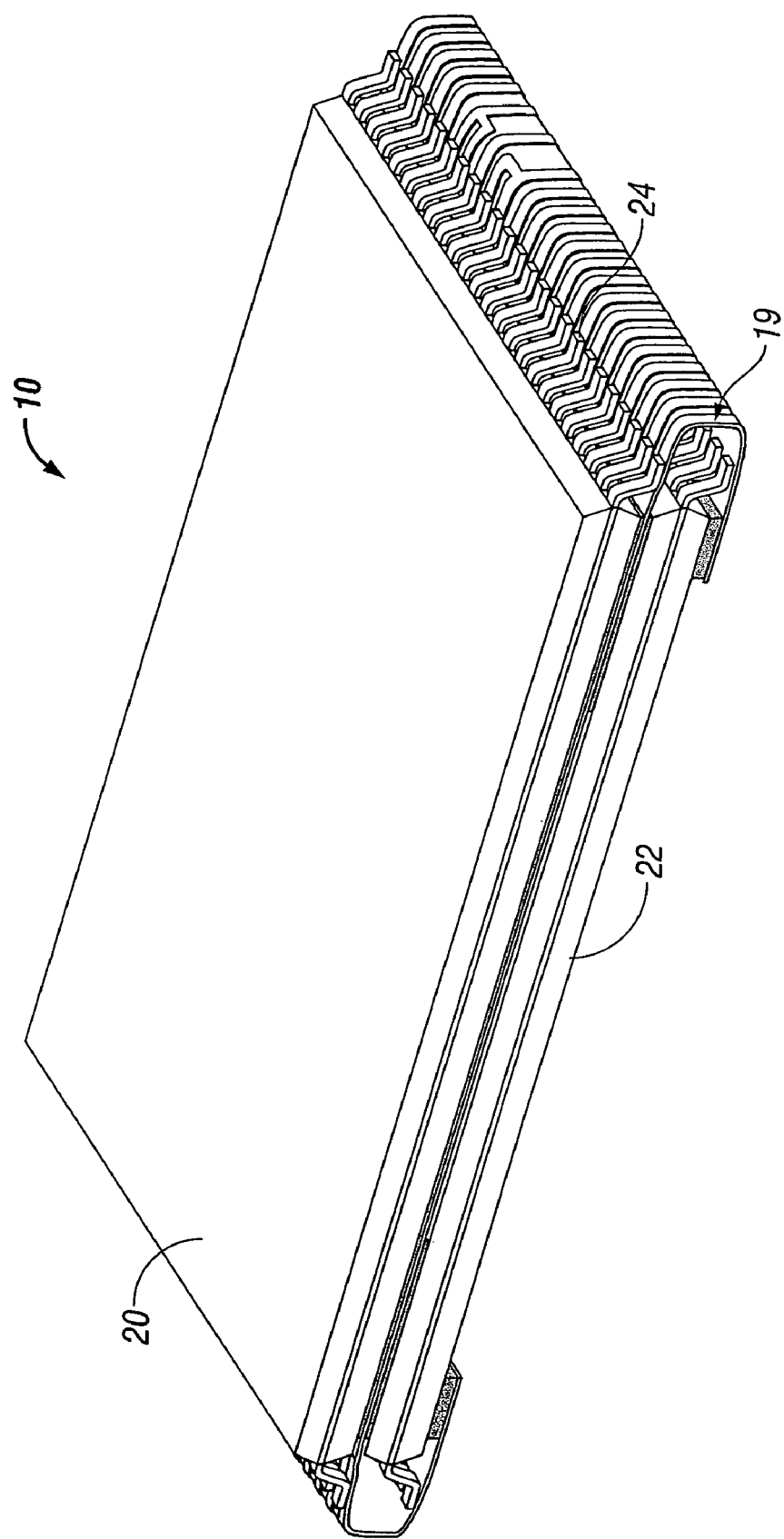

LEADED PACKAGE INTEGRATED CIRCUIT STACKING

TECHNICAL FIELD

This invention relates to stacking leaded integrated circuit devices. More particularly, this invention relates to stacks of leaded integrated circuits and associated flex circuitry.

BACKGROUND

A variety of systems and techniques are known for stacking packaged integrated circuits. Some techniques are devised for stacking chip-scale packaged devices (CSPs) while other systems and methods are better directed to leaded packages which exhibit a set of leads extending from at least one lateral side of a typically rectangular package.

Memory devices are packaged in both chip-scale (CSP) and leaded packages. However, techniques for stacking CSP devices are typically not optimum for stacking leaded devices. Although CSP devices are gaining market share, in many areas integrated circuits continue to be packaged in high volumes in leaded packages. For example, the well-known flash memory integrated circuit is typically packaged in leaded packages with fine-pitched leads emergent from one or both sides of a package. A common package for flash memory is a fine pitch thin small outline package commonly known as the TSOP. Flash circuitry in TSOP packaging typically differs from common TSOP-packaged DRAMs in that flash TSOPs typically exhibit fine pitch leads emergent from the shorter pair of the lateral sides of the package while DRAM TSOPs typically exhibit leads emergent from the longer pair of sides of the package.

The assignee of the present invention, Staktek Group L.P., has developed a wide variety of techniques, systems and designs for stacks and stacking with both leaded and CSP devices. In leaded package stacking, Staktek Group L.P. has developed rail bus systems that interconnect the leads of stacked leaded IC devices by use of rails. The present assignee also owns, for example, U.S. Pat. No. 6,572,387 issued Jun. 3, 2003 and U.S. patent application Ser. No. 10/449,242 published as Pub. No. 2003/0203663 A1 which disclose and claim various techniques and apparatus related to stacking leaded packages.

Many other techniques have been developed that use various means for interconnecting the leads of the stacked devices. For example, U.S. Pat. No. 4,696,525 to Coller et al. teaches a socket connector for coupling adjacent devices in a stacked configuration to one another. The socket has external conductors that interconnect leads from like, adjacent devices to one another. Sockets, however, are limited in several respects. They are not versatile in their ability to implement complex interconnections. In addition, such sockets, which have relatively thick, plastic bodies, act as heat insulators between adjoining upper and lower (major) package surfaces, which can inhibit the module's overall ability to dissipate heat.

Although the art has many techniques for stacking leaded devices, a new system and method for stacking leaded package devices is a welcome development. Accordingly, the present application discloses improved systems and methods for electrically and thermally coupling adjacent integrated circuit devices in stacked modules.

SUMMARY OF THE INVENTION

The present invention provides a system and method for electrically and thermally coupling adjacent IC packages to one another in a stacked configuration. A flex circuit having an interconnective pattern is inserted between ICs to be stacked. A part of the flex circuit emerges from between the ICs and provides a connective field that provides plural contact areas that connect to respective leads of the ICs. Thus, the flex does not require discrete leads which must be individually aligned with the individual leads of the constituent ICs employed in the stack. The principle may be employed to aggregate two or more contact areas for respective connection to leads of constituent ICs but is most profitably employed with a continuous connective field that provides contact areas for many leads of the ICs.

BRIEF DESCRIPTION OF THE DRAWINGS

FIG. 17 is a perspective view of a stacked module in accordance with another alternative preferred embodiment of the present invention.

DETAILED DESCRIPTION

Figure 1A:
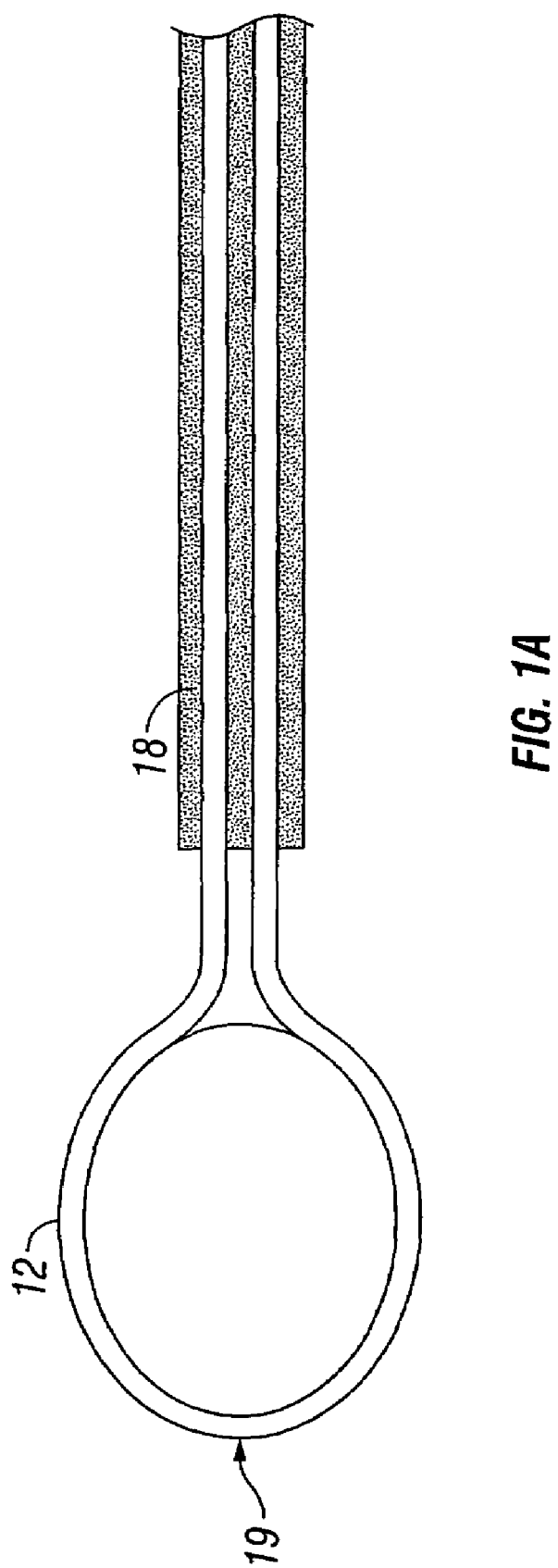
FIG. 1A depicts one embodiment of a flex circuit that may be employed in accordance with a preferred embodiment of the present invention.

FIG. 1A depicts a cross-sectional view of a part of one embodiment of a flex circuit that may be employed in accordance with a preferred embodiment of the present invention. Depicted flex circuit 12 is an exemplar flex circuit embodiment that may be employed in accordance with the present invention in stacked modules comprised of leaded packaged integrated circuits. Depicted exemplar flex circuit 12 exhibits at least one connective field 19 which before inclusion in a module, typically will exhibit a loop-like or arcuate shape but may exhibit other shapes. An arcuate shape such as the one depicted as an example is typically deformed to be more adapted with the shape of the leads of the constituent ICs of a module in compliance with a preferred embodiment of a method for devising a stacked IC module in accordance with the present invention. The cross-section of FIG. 1A further depicts adhesive 18 disposed along at least a part of flex circuit 12 for adherence to ICs when flex circuit 12 is employed in a module.

Figure 1B:
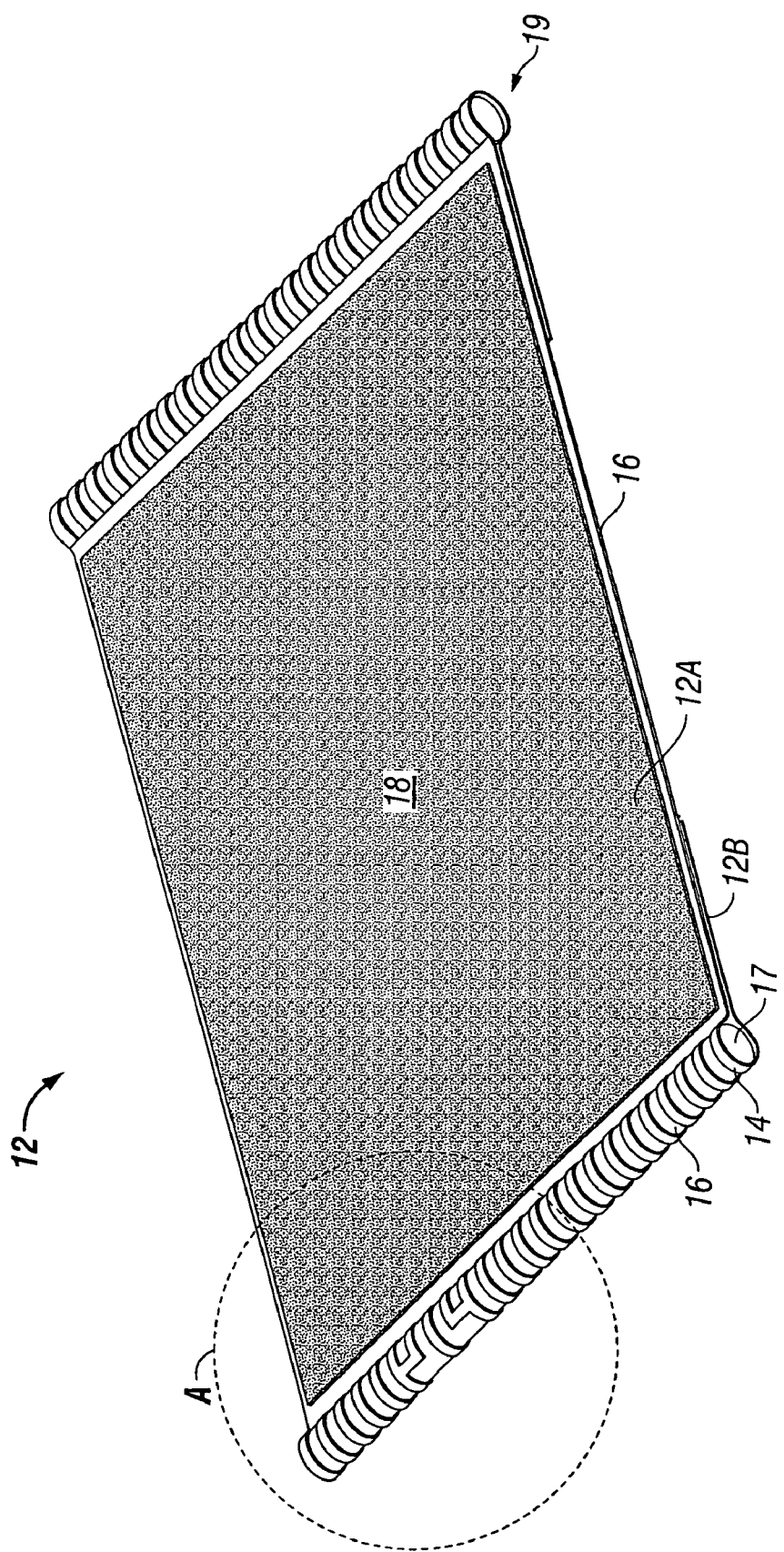
FIG. 1B depicts an embodiment of a flex circuit in accordance with an embodiment of the present invention.

FIG. 1B is another depiction of a flex circuit 12 that may be employed to advantage in accordance with some preferred embodiments of the present invention. Flex circuit 12 is comprised of two layers, one of which is a substrate layer 16 and the other of which layers is a conductive layer 14L which provides plural contact areas 14 of the more than one connective fields 19 as shown. Plural contact areas 14 are held in spaced apart relation by their adherence on substrate layer 16. Typically, connective field 19 is configured in a loop-like or arcuate configuration. When flex circuit 12 is disposed between ICs in a module, the leads of the ICs then make contact with connective field 19 and typically deform connective field 19 through compression to encourage adaptation of the shape of connective field 19 to the configuration of the leads. Thus, the arcuate configuration of connective field 19 improves contact between the contact areas 14 with the respective leads of the constituent ICs of the module. Connective field 19 could, however, be devised in any shape so long as it exhibits plural contact areas 14 for contact with at least two respective leads from an integrated circuit (packaged) of the module to be created. As another example, connective field 19 could be more of a folded structure that exhibits plural contact areas 14 spaced apart laterally as part of a contiguous structure to allow the single structure of the flex circuit to be used to position a plurality of contact areas adjacent to a plurality of package leads in typically a one-to-one correspondence but it is advantageous in typical embodiments to have connective field 19 take a natural arcuate shape before flex circuit 12 is included in a module. Further the connective field need not be a closed loop. By having plural contact areas 14, connective field 19 allows plural contact areas 14 to be aligned with their respective leads in a stacked module thus avoiding the more difficult task of aligning individually each discrete lead from a flex circuit with the associated lead from ICs of the stacked module.

Flex circuit 12 may have more than two layers but is shown with layers 14L and 16 as an efficient and simple construction that may be employed in devising modules in accordance with preferred embodiments of the present invention. As those of skill will appreciate, flex circuitry with more than two layers may readily be employed particularly where especially complex electrical connections are required. Adhesive 18 is shown on flex circuit 12 and an optional form 17 is shown within connective field 19. Adhesive 18 may also be disposed on ICs 20 and/or 22 in addition to or instead of on flex circuit 12 when constructing a module in accordance with some embodiments of the present invention. Optional form 17 is preferably an elastomer to provide a ready preformed shape for configuration of a connective field 19 and encourage compressive forces to enhance contact between contact areas 14 and leads of ICs 20 and 22.

Flex circuit 12 is shown with substantially planar portion 12A that resides between ICs in a stacked module devised in accordance with some embodiments of the present invention. An optional portion 12B of flex circuit 12 is also resident between ICs in a stacked module and typically resides beneath a part of portion 12A.

Conductive layer 14L and connect areas 14 are preferably comprised of copper although any conductive material may be employed for such purposes. A more preferred copper layer would be thin and ductile copper deposited upon substrate layer 16 that is preferably a polyimide. An etched copper or other conductive material may also be used as a conductive layer 14L but a conductive layer 14L deposited on a substrate would be preferred.

Figure 2:
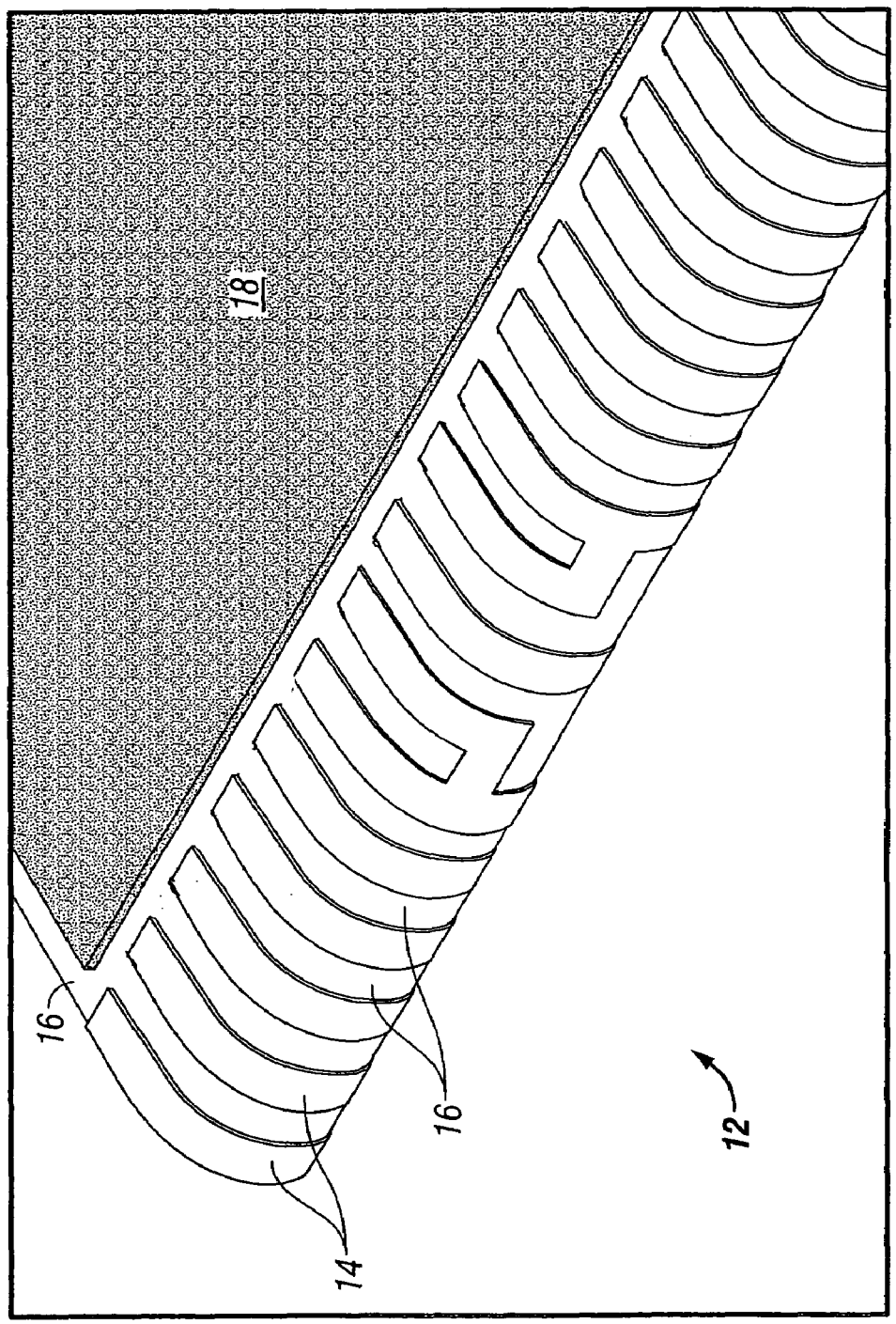
FIG. 2 depicts an enlargement of the area marked "A" in FIG. 1B.

FIG. 2 depicts an enlargement of the area marked "A" in FIG. 1. Contact areas 14 are shown in spaced apart relation on substrate layer 16. Thin film adhesive 18 is shown on flex circuit 12. Those of skill will recognize that thin film adhesive 18 is not required but a thin film adhesive is a well understood method for adhering flex circuit 12 in module 10 as later depicted and preferred adhesives will have thermal conductivity properties to enhance the thermal conduction between the ICs in a module.

Figure 3:
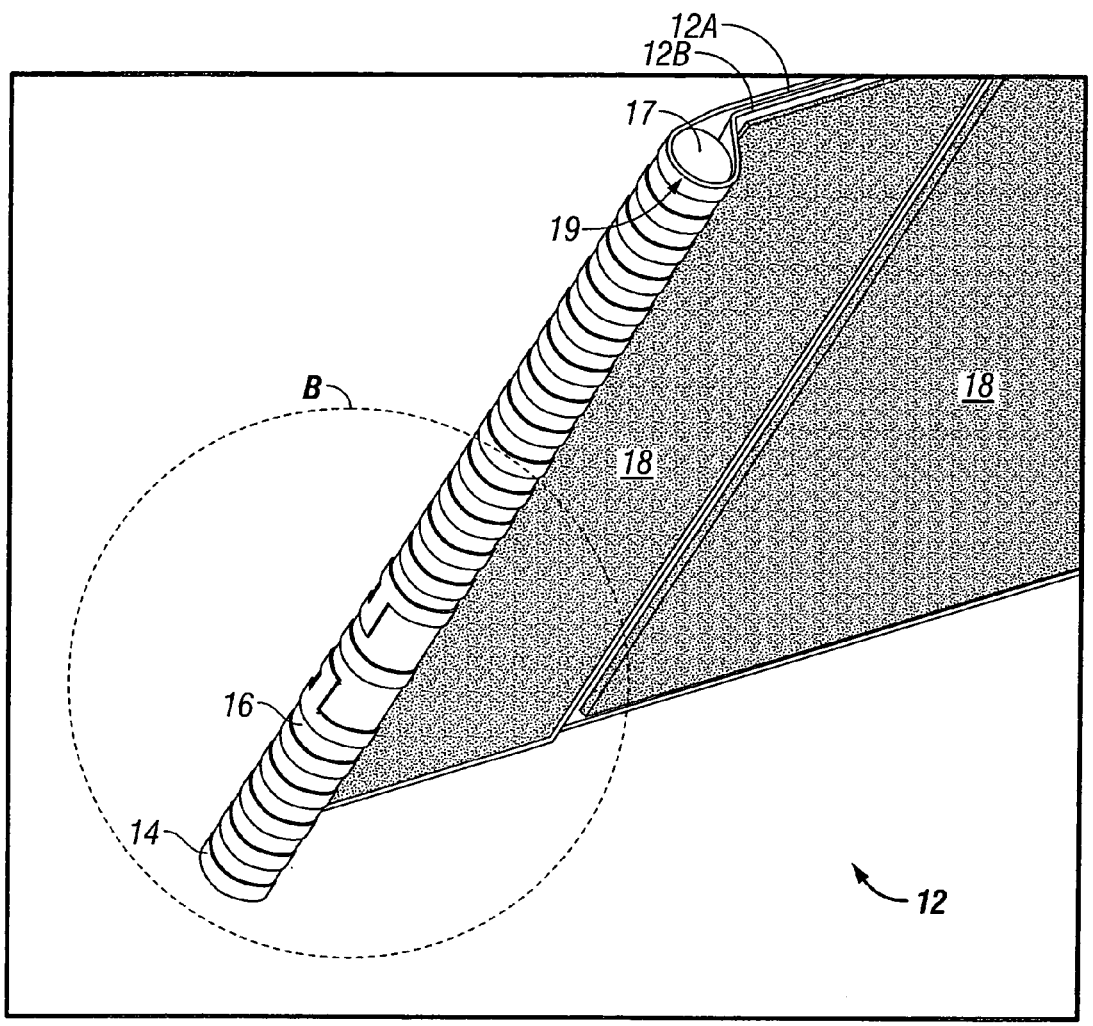
FIG. 3 depicts another aspect of a flex circuit in accordance with a preferred embodiment of the present invention.

FIG. 3 depicts another aspect of exemplar flex circuit 12 in accordance with a preferred embodiment of the present invention. As shown in FIG. 3, flex circuit 12 exhibits connective field 19 and a part of flex circuit 12 identified as 12B is disposed under upper portion 12A of flex circuit 12 in the depicted embodiment of flex circuit 12. Other flex circuits may be employed with preferred modules in accordance with alternative embodiments of the present invention where an overlap of a part 12A and 12B is not present and an example of which construction will be later shown.

Figure 4:
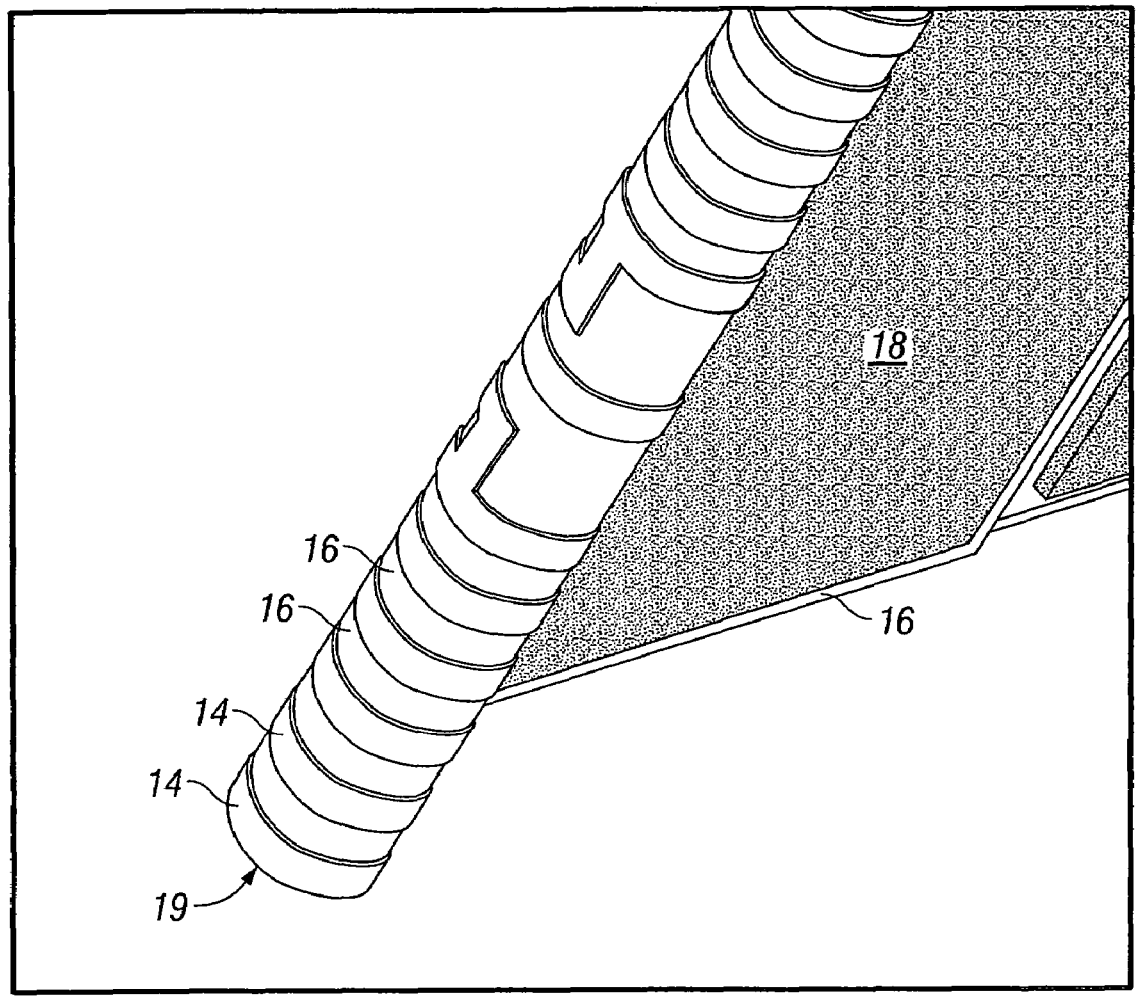
FIG. 4 depicts an enlargement of the area marked "B" in FIG. 3.

FIG. 4 depicts an enlargement of the area marked "B" in FIG. 3 showing in more detail a part of connective field 19 and the contact areas 14 that provide connective facility between the flex circuit and the leads of constituent ICs of a module devised in accordance with a preferred embodiment.

Figure 5:
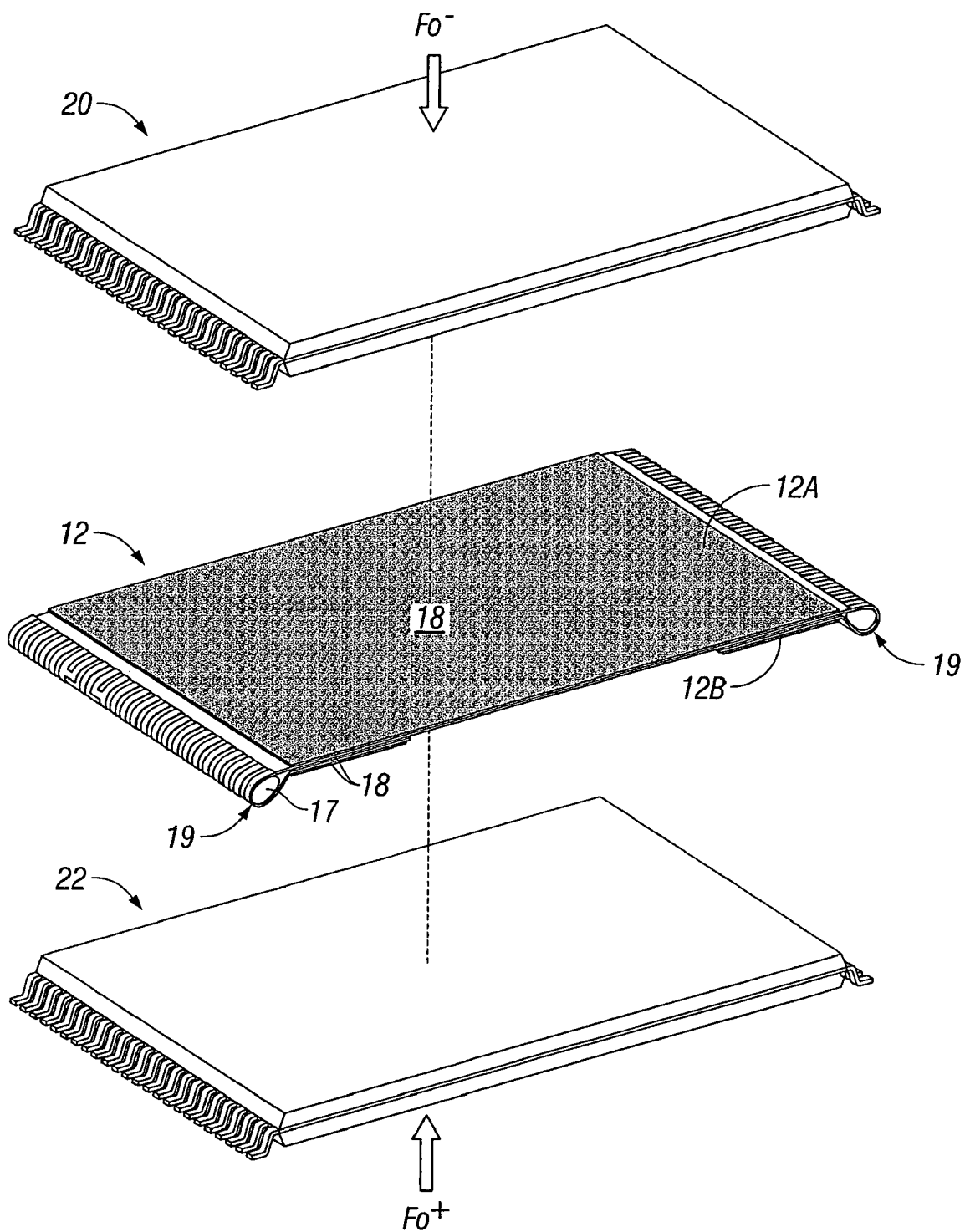
FIG. 5 is an exploded view of a stacked module devised in accordance with a preferred embodiment of the present invention.

FIG. 5 is an exploded view of an exemplar stacked module 10 devised in accordance with a preferred embodiment of the present invention. Exemplar module 10 is comprised of upper leaded IC 20 and lower leaded IC 22. The present invention may be employed with other circuitry besides and in addition to flash memory including, just as non-limiting examples, DRAMs, FPGAs, system stacks that include logic and memory and communications or graphics modules. It should be noted therefore, that there the depicted profile for ICs 20 and 22 is not a limitation and that upper and lower ICs 20 and 22 respectively need not be TSOPs or TSOP-like and the packages employed need not have only one die or even leads emergent from two sides. For example, a module in accordance with embodiments of the present invention may employ ICs 20 and 22 that have dual die within each package and may exhibit ICs that have leads emergent from only one side of the package. Further, a module 10 in accord with the present invention need not have only two ICs as the invention may be employed to devise a stacked module 10 with two or more ICs as those of skill will understand after appreciating this disclosure.

Flex circuit 12 is disposed between ICs 20 and 22 and force (represented by Fo+ and/or Fo in the Fig.) with or without heat is applied to bring together the components flex circuit 12 and ICs 20 and 22. As a result, connective field 19 is preferably compressed to have conformity with the configurations of the leads of the constituent ICs thus improving contact between contact areas 14 and respective leads. Those of skill will recognize that flex circuit 12 may be constructed in two pieces with one piece for each of connective fields 19 and such a construction, although less than preferred, should be understood to be within the scope of the present invention. Further, identified adhesive 18 may be applied to the ICs 20 and/or 22 in addition to or in place of its disposition on flex circuit 12 but that use of a thin file adhesive on flex circuit 12 is preferred for efficient construction.

When ICs 20 and 22 are brought together with flex circuit 12 between, portions of contact areas 14 exposed around parts of connective fields 19 are preferably disposed in contact with leads 24 of ICs 20 and 22 and, in preferred embodiments, contact between leads 24 and appropriate contact areas 14 is preferably realized while connective field 19 deforms in compliance with the configurations of the constituent IC leads. Solder as shown in later Figs. is then preferably employed between leads and contact areas 14. A module could be built in accordance with an embodiment in which no solder was employed and compression between leads 24 and flex circuit 12 was the sole realization of the contact between contact areas 14 and respective leads 24 but as those of skill will recognize, such a construction would not be preferred. Further, a module in accordance with an alternative embodiment could be devised in which the contact areas 14 do not touch the respective leads but await realization of electrical contact with solder or other conductive attachment. Other forms of bonding other than solder between contact areas 14 and leads 24 may also be employed (such as brazing or welding for example) but soldering techniques are well understood and adapted for use in large scale manufacturing.

Figure 6:
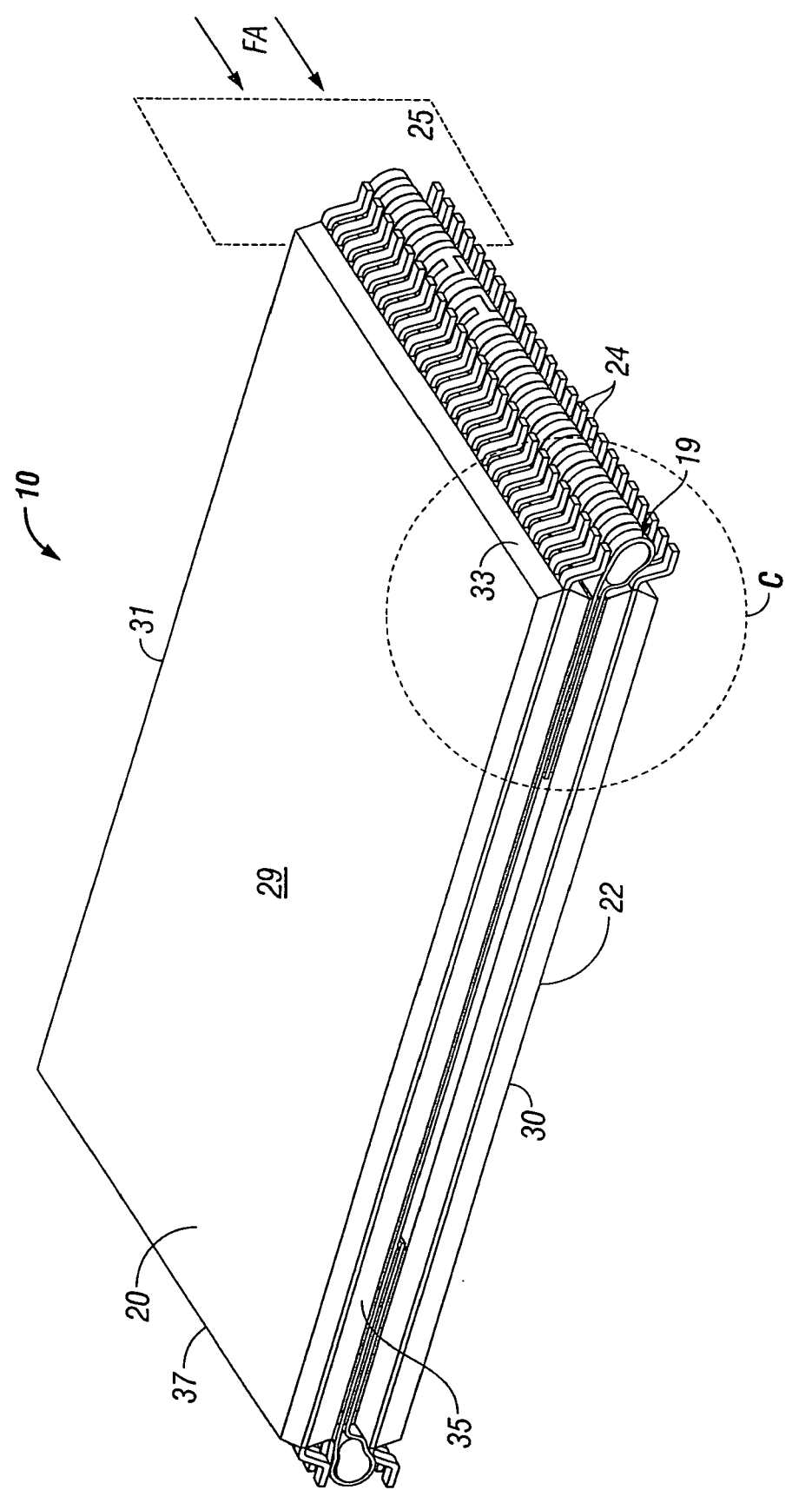
FIG. 6 is a perspective view of a stacked module devised in accordance with a preferred embodiment of the present invention.

FIG. 6 is a perspective view of a module 10 showing ICs 20 and 22 in stacked disposition with connective field 19 of flex circuit 12 having contact areas 14 in contact with respective ones of the leads of ICs 20 and 22. ICs 20 and 22 have four sides 31, 33, 35, and 37 with leads 24 emergent from at least one of said sides with the particular configuration of IC shown having leads emergent from two opposite sides of the respective package. Upper surface 29 and lower surface 30 of the ICs are also identified in FIG. 6. Those of skill will recognize that the identified "sides" need not be perpendicular to respective upper and lower surfaces 29 and 30 of ICs 20 and 22.

FIG. 6 illustrates that, in devising a module in accordance with the present invention, some embodiments may be constructed with the assistance of a mechanical fixture 25 and fixture 25 and module 10 may be brought together (see force FA) to correlate connective field 19 of flex circuit 12 with leads 24 of ICs 20 and 22 so as to align leads 24 and contact areas 14 of connective field 19 of flex circuit 12 by pushing on either leads or the flex as the case may be. As those of skill will recognize, embodiments of the present invention assist in avoidance of what would otherwise be difficult registration and correlation between discrete leads from a flex circuit and individual leads 24 of ICs 20 and 22.

Figure 7:
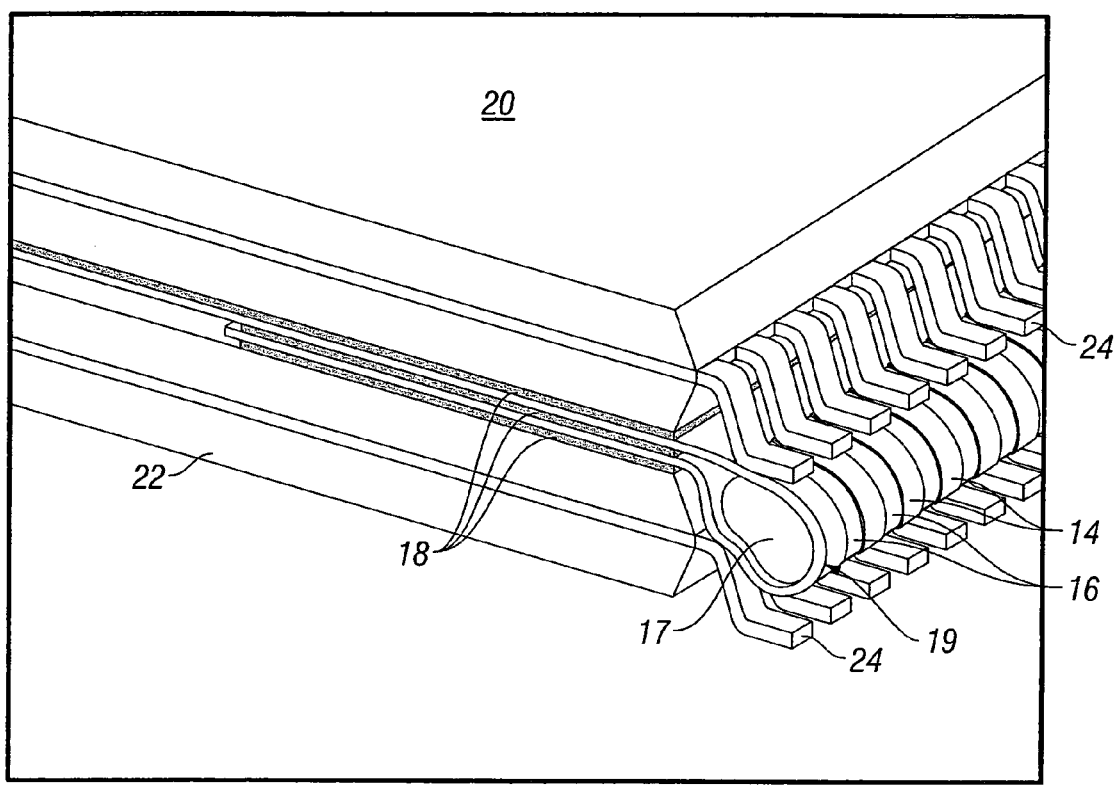
FIG. 7 is a depiction of an enlarged area marked "C" from FIG. 6 above.

FIG. 7 shows greater detail of the area marked "C" in FIG. 6 and shows that ICs 20 and 22 are in thermal contact through adhesive layers 18 and parts of flex circuit 12 that lie between ICs 20 and 22. Connective field 19 of flex circuit 12 about optional form 17 shows contact areas 14 in contact with leads 24 of ICs 20 and 22 as substrate layer 16, which is preferably a dielectric layer such as polyimide for example, is shown between contact areas 14 and preferably holds contact areas 14 in spaced apart relation. There is shown a one-to-one correspondence between individual contact areas 14 and individual respective leads of ICs 20 and 22 but in some more unusual instances, a wider contact area 14 may be in contact with two or more side-by-side leads 24 of an IC if the electrical connections require such a configuration.

Figure 8:
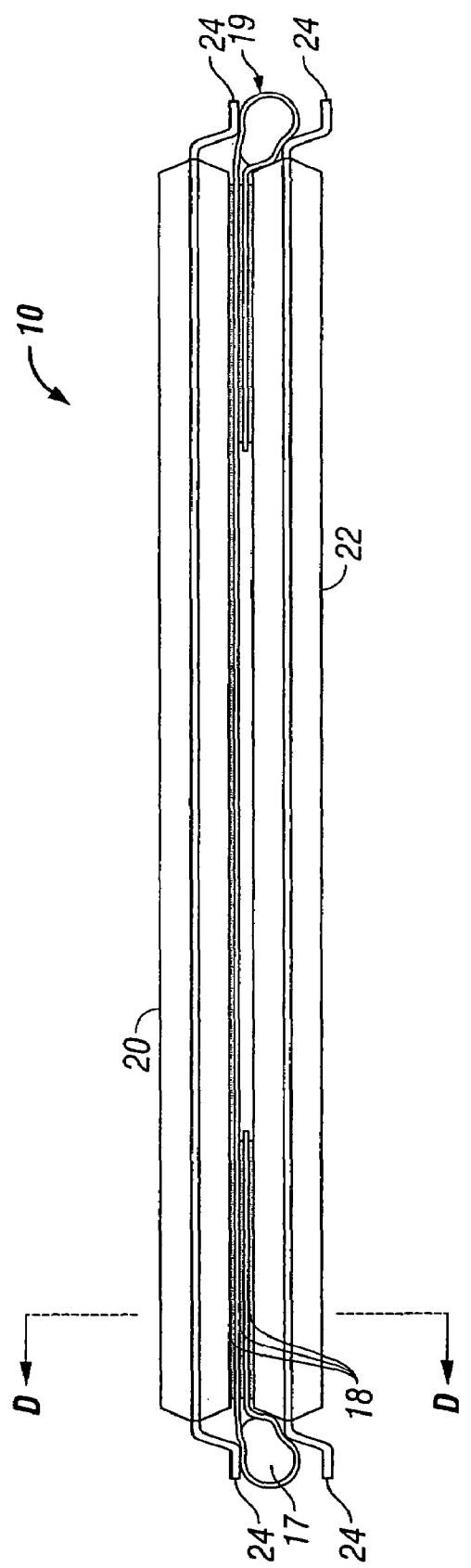
FIG. 8 is a side view of a stacked module in accordance with a preferred embodiment of the present invention.

FIG. 8 is a side view of a module 10 devised in accordance with a preferred embodiment of the present invention. Module 10 includes ICs 20 and 22 and illustrates flex circuit 12 in part between said ICs 20 and 22 with thin film adhesive layers 18. Flex circuit 12 is shown with connective field 19 about form 17. Examples of module 10 in a variety of different profiles may be devised in compliance with the present invention and the methods of the present invention modules 10 may be devised to present profiles in compliance with a variety of application requirements.

Figure 9:
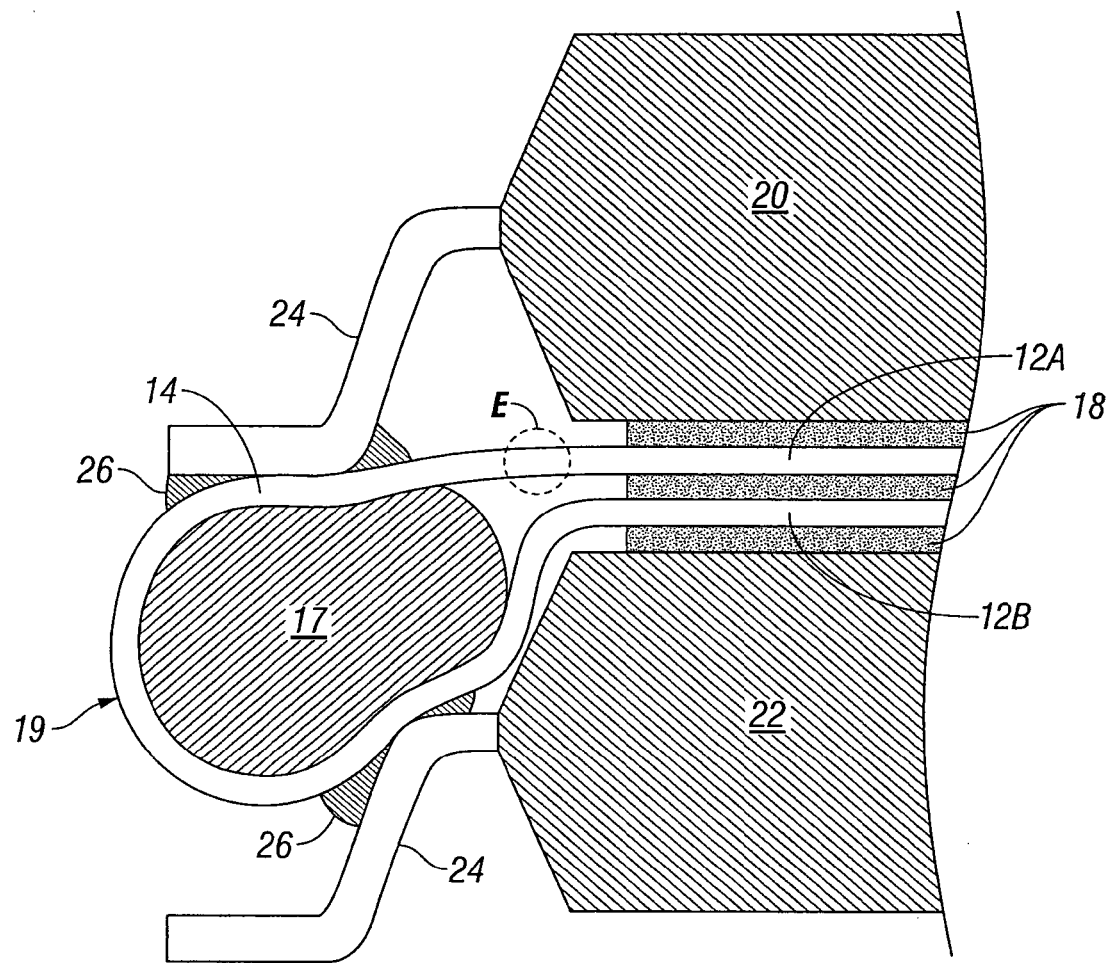
FIG. 9 depicts an enlarged view of the area marked "D" in FIG. 8.

FIG. 9 is an enlarged depiction of a cross-section through the area marked "D" in FIG. 8. Flex circuit 12 is shown disposed with portion 12A between ICs 20 and 22. Flex circuit 12 emerges from the ICs to provide connective field 19 which has as earlier shown, plural contact areas 14 for connection to leads 24. In the depicted embodiment, flex circuit 12 after transit through connective field 19 then re-enters between ICs 20 and 22 as portion 12B which is in the depicted embodiment disposed beneath portion 12A. Solder 26 is shown in FIG. 9 and is employed to secure electrical connection between respective contact areas 14 and respective leads 24.

Figure 10:
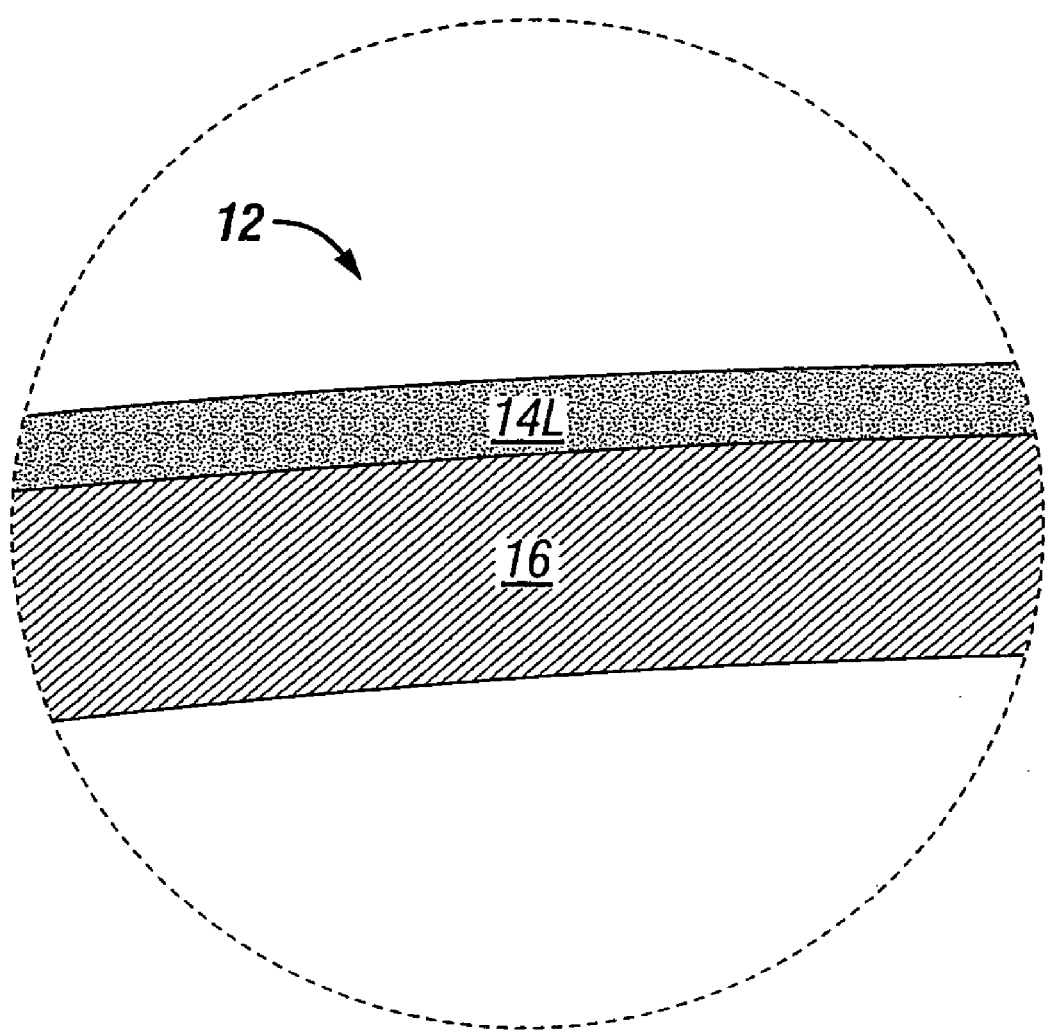
FIG. 10 depicts an enlarged view of a part of the area marked "E" in FIG. 9.

FIG. 10 is an enlarged depiction of the area marked "E" in FIG. 9 and illustrates in cross-section exemplar flex circuit 12 with conductive layer 14L and substrate layer 16.

Figure 11:
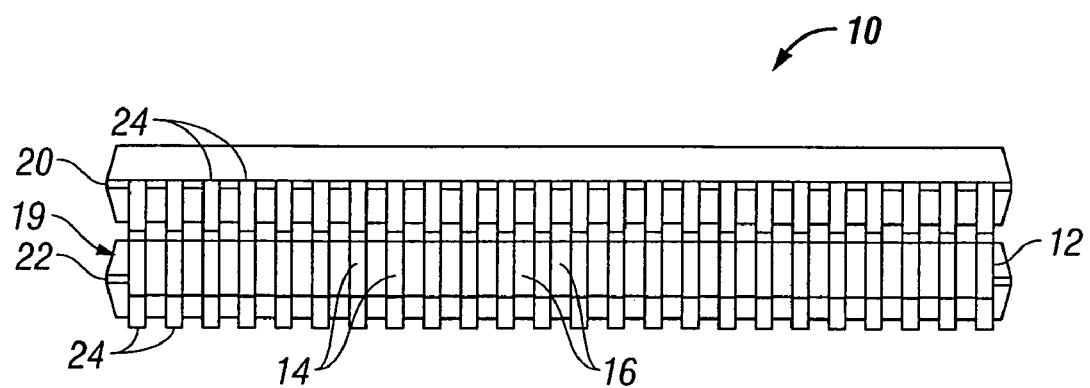
FIG. 11 is a view of a stacked module in accordance with a preferred embodiment of the present invention.

FIG. 11 illustrates an end view of module 10 illustrating connective field 19 along leads 24 of ICs 20 and 24. Those of skill will recognize that this is an end on view if ICs 20 and 22 are typical flash TSOPs while if the stacked module 10 is devised with TSOP DRAMs, the depiction of FIG. 11 is more an exemplification of a side view of module 10.

Figure 12:
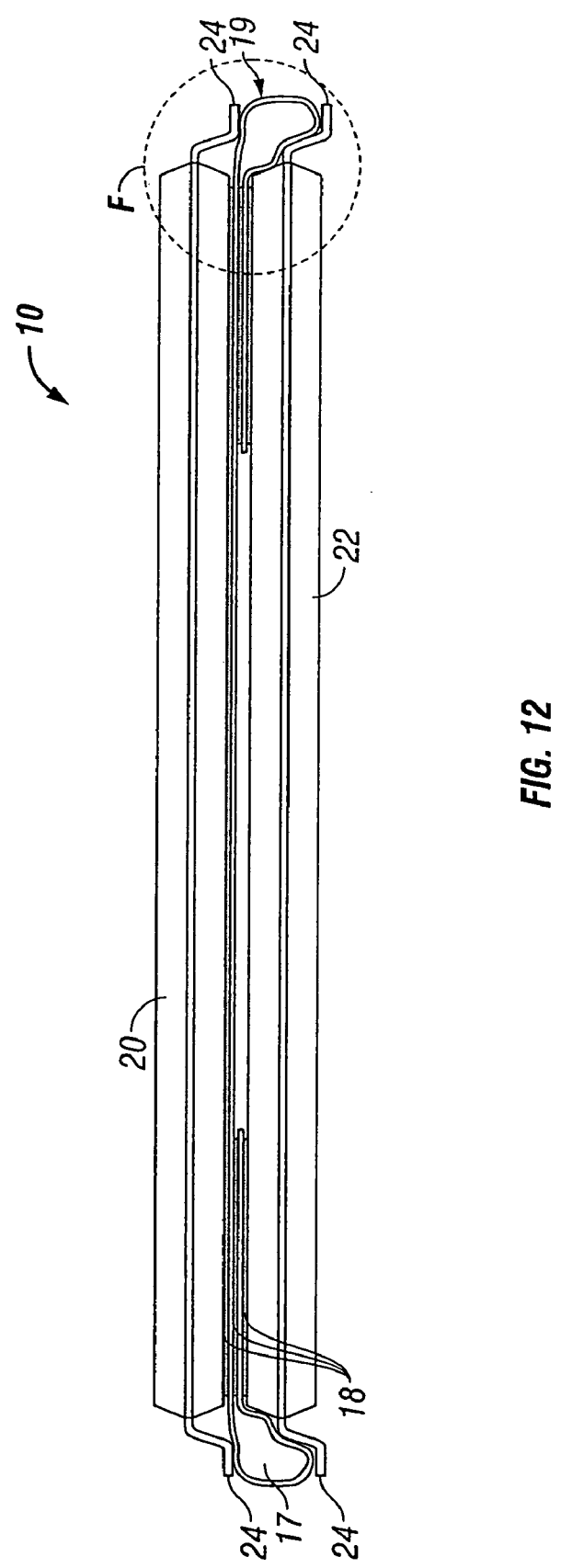
FIG. 12 is another side view of a stacked module in accordance with an alternative preferred embodiment of the present invention.

FIG. 12 is a side view of a module 10 devised in accordance with an alternative preferred embodiment of the present invention. In depicted module 10 of FIG. 12, flex circuit 12 exhibits a connective field 19 that provides more area for contact areas 14 to be in contact with leads 24 of ICs 20 and 22 when ICs 20 and 24 are disposed about flex circuit 12. This is shown in greater detail in FIG. 13 which is an enlarged depiction of the area marked with "F" in FIG. 12.

Figure 13:
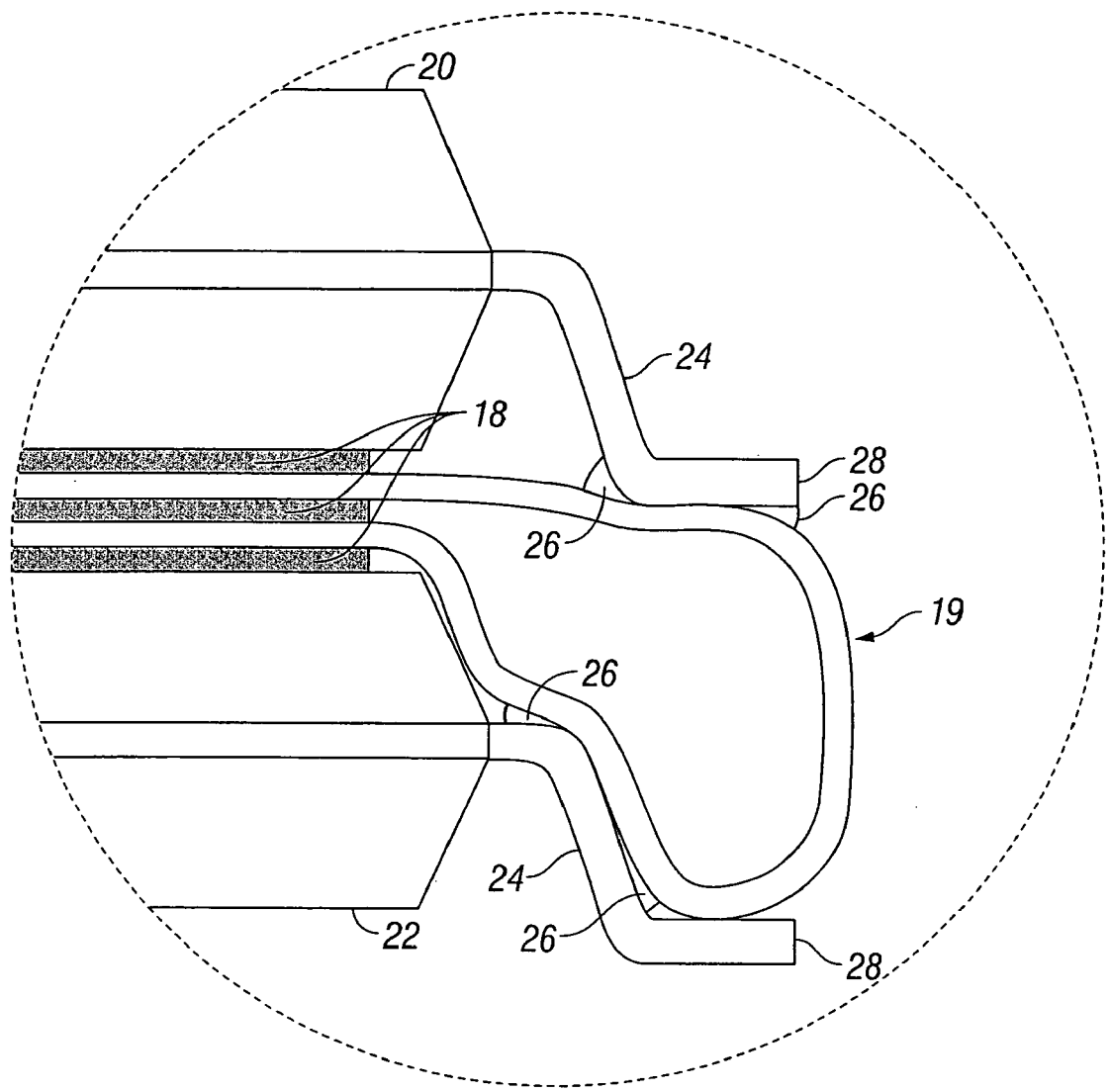
FIG. 13 is depicts an enlarged view of the area marked "F" in FIG. 12.

FIG. 13 illustrates connective field 19 of flex circuit 12 (without use of a form 17) and by extension, contact areas 14 disposed in proximal compression with respective leads 24 of upper IC 20 and lower IC 22. It will be noted that in the depicted embodiment, flex circuit 12 emerges from between ICs 20 and 22 as shown with respect to earlier illustrated embodiments and then re-enters between ICs 20 and 22.

Figure 14:
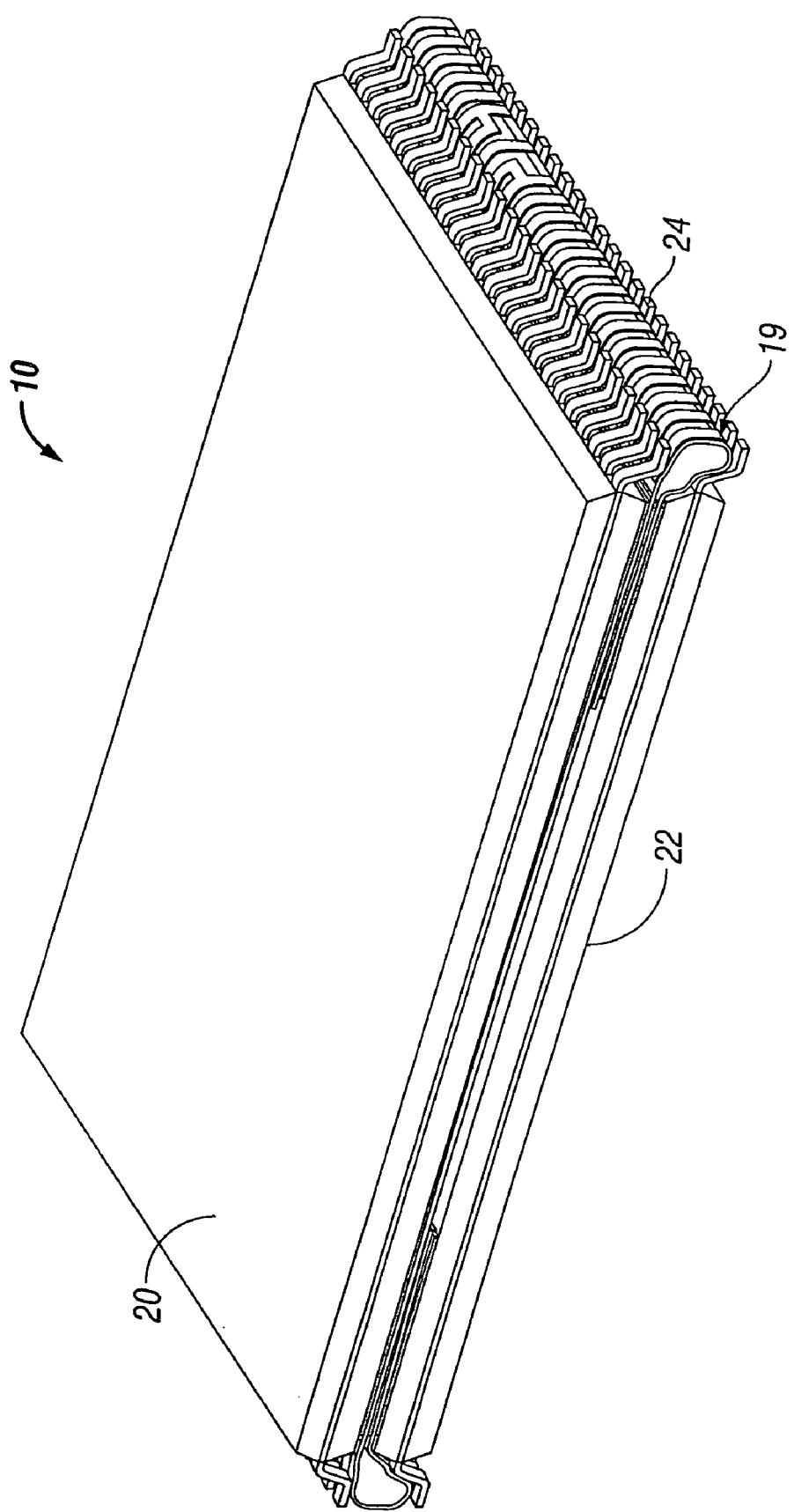
FIG. 14 is a perspective view of a stacked module in accordance with an alternative preferred embodiment of the present invention.

FIG. 14 is a perspective view of a module 10 that illustrates the continuous nature of connective field 19 across more than one contact area for connection with more than one lead 24 thus avoiding the use of separated leads to realize connections between respective leads of ICs 20 and 22 which as those of skill will appreciate, leads to manufacturing advantages in avoidance of the need for fine registration between individual fine pitch leads from ICs 20 and 22 and corresponding individual fine pitch leads from flex circuitry for interconnection of the constituent ICs.

Figure 15:
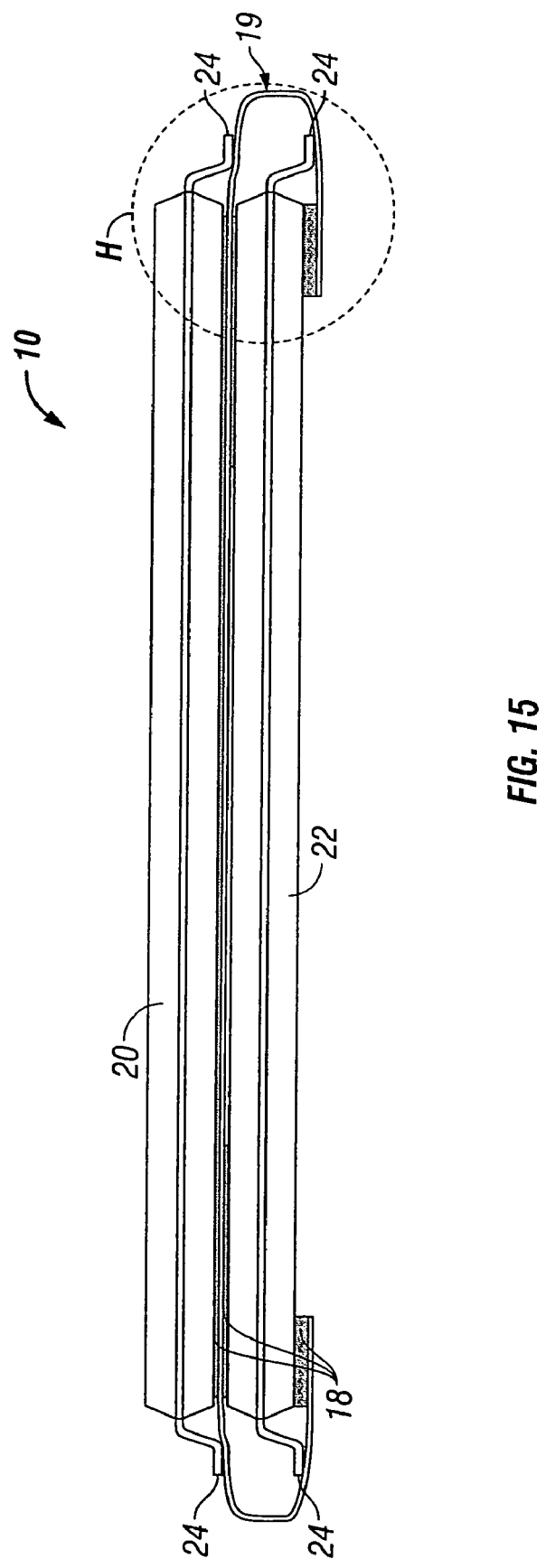
FIG. 15 is a side view of a stacked module in accordance with another alternative preferred embodiment of the present invention.

FIG. 15 illustrates a stacked module 10 in accordance with an alternative preferred embodiment of the present invention. Unlike earlier depicted embodiments, the embodiment of module 10 depicted in FIG. 15 employs flex circuit 12 to provide connective field 19 but does not exhibit a return of a part 12B of flex circuit 12 to the area in between ICs 20 and 22 but instead, a portion of flex circuit 12 identified as portion 12C is adhered to the bottom surface 30 of lower IC 22 with adhesive 18 as shown in greater detail in FIG. 16.

Figure 16:
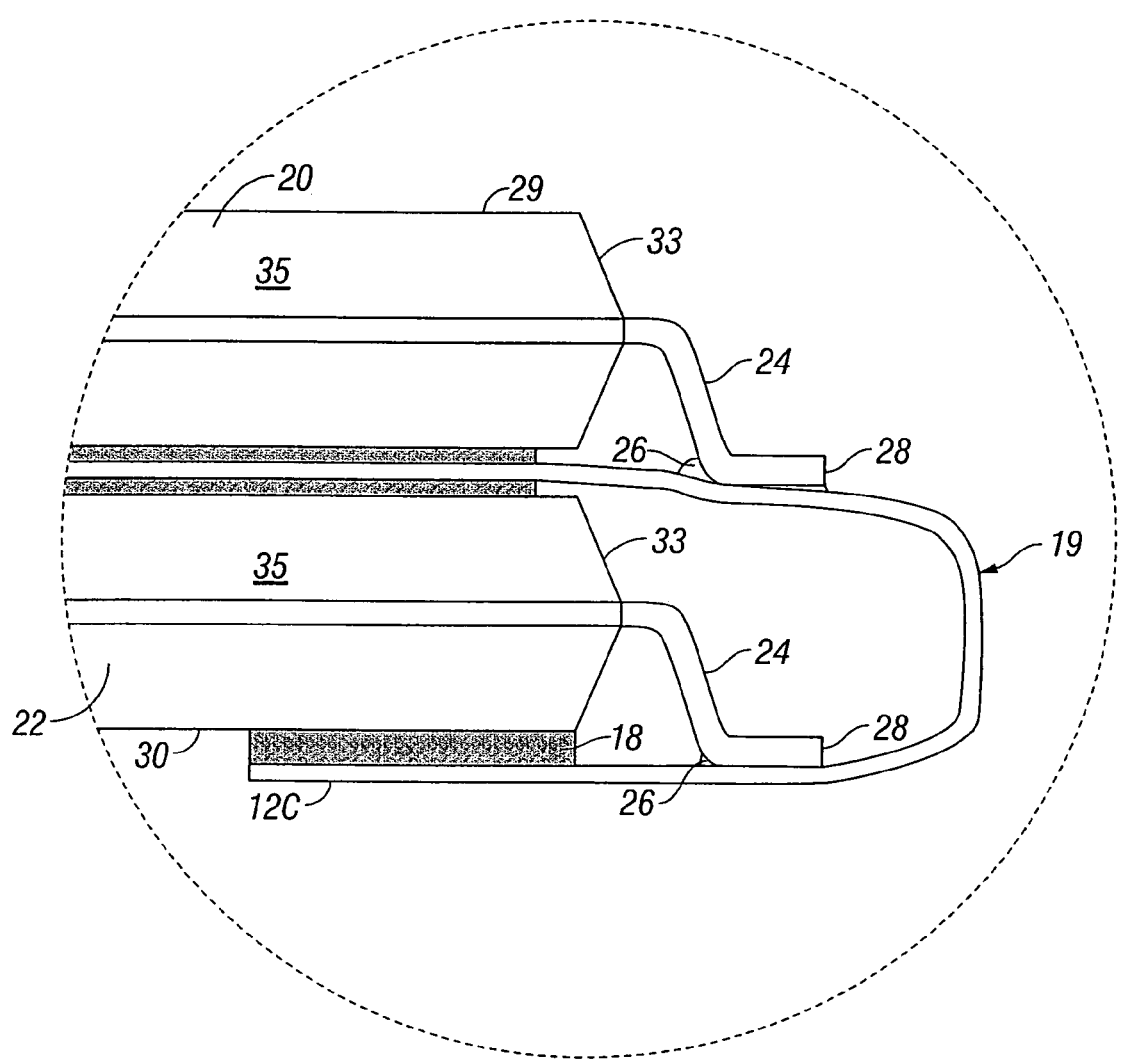
FIG. 16 is a depiction of an enlarged view of the area marked "H" in FIG. 15.

FIG. 16 is an enlarged depiction of the area marked "H" in FIG. 15. As illustrated, flex circuit 12 emerges from between IC 20 and IC 22 and exhibits connective field 19 but is disposed so as to be proximal to the lower side of feet 28 of respective leads 24 of ICs 20 and 22. In the depicted embodiment, portion 12C of flex circuit 12 is disposed along a portion of lower surface 30 of lower IC 22.

FIG. 17 is a perspective view of a stacked module 10 in accordance with an alternative preferred embodiment of the present invention as shown in earlier FIGS. 15 and 16.

Although the present invention has been described in detail, it will be apparent to those skilled in the art that many embodiments taking a variety of specific forms and reflecting changes, substitutions and alterations can be made without departing from the spirit and scope of the invention. Therefore, the described embodiments illustrate but do not restrict the scope of the claims.

The invention claimed is:

1. A stacked IC module comprising:
   (a) first and second leaded packages in stacked disposition, each of the first and second leaded packages having plural leads emergent along at least one side of each of the respective leaded packages;
   (b) a flexible circuit disposed in part between the first and second leaded packages, the flexible circuit presenting plural contact areas maintained in a spaced-apart relation and which are a part of a contiguous connection field of the flexible circuit, each of which plural contact areas being connected to respective ones of the plural leads emergent along at least one side of the first and second packages so as to effectuate selective connections between the first and second leaded packages without employment of discrete distal ends of flexible circuit conductors, in which the flexible circuit is comprised of at least two layers, one of the at least two layers being comprised of a conductive material and another of the at least two layers being comprised of dielectric.

2. The stacked IC module of claim 1 in which two portions of the flexible circuit are disposed between the first and second leaded packages.

3. The stacked IC module of claim 2 in which an adhesive is disposed between the flex circuit and the first and second leaded packages.

4. The stacked IC module of claim 3 in which the adhesive is thermally conductive.

5. The stacked IC module of claim 3 in which the adhesive is a thin film adhesive.

6. The stacked IC module of claims 1 or 2 in which the first and second leaded packages include flash memory circuitry.

7. The stacked IC module of claims 1 or 2 in which the connective field is disposed about a form.

8. The stacked IC module of claim 7 in which the form is comprised of elastomer.

9. The stacked IC module of claim 1 in which the one of the at least two layers comprised of a conductive material is deposited on the other of the at least two layers that is comprised of a dielectric.

10. The stacked IC module of claim 1 in which the flexible circuit includes a layer which is deposited and is comprised of copper.

11. The stacked IC module of claim 1 in which the flexible circuit includes a layer which is etched and is comprised of copper.

12. A stacked IC module comprising:
   (a) first and second leaded packages in stacked disposition, each of the first and second leaded packages having plural leads emergent along at least one side of each of the respective leaded packages;
   (b) a flexible circuit disposed in part between the first and second leaded packages, the flexible circuit presenting plural contact areas maintained in a spaced-apart relation and which are a part of a contiguous connection field of the flexible circuit, each of which plural contact areas being connected to respective ones of the plural leads emergent along at least one side of the first and second packages so as to effectuate selective connections between the first and second leaded packages without employment of discrete distal ends of flexible circuit conductors, in which the flexible circuit is comprised of at least two layers, one of the least two layers being comprising of a dielectric and a second layer comprised of a conductive material of which the plural contact areas are a part and the plural contact areas are held in spaced apart relation by their affixation to the first layer.

13. A stacked IC module comprising:
   first and second ICs in stacked disposition;
   a flexible circuit having a substantially planar portion disposed between the first and second ICs and the flexible circuit having first and second connective fields configured to present plural contact areas held in spaced apart relation by a dielectric layer of the flexible circuit upon which there is a conductive layer of which the plural contact areas are a part, the plural contact areas being in electrical contact with leads of the first and second ICs in which a portion of the flexible circuit is disposed beneath the lowermost of the first and second ICs in the stacked module.

14. The stacked IC module of claim 13 in which the conductive layer of the flexible circuit is comprised of copper.

15. The stacked IC module of claim 14 in which the conductive layer is deposited upon the dielectric layer.

16. The stacked IC module of claim 15 in which the dielectric layer is polyimide.

17. The stacked IC module of claim 13 in which the first and second conductive fields transit about forms.

18. The stacked IC module of claim 17 in which the forms are comprised of an elastomer.

19. The stacked IC module of claim 13 in which there is adhesive between the flexible circuit and at least one of the first and second ICs.

20. The stacked IC module of claim 19 in which the adhesive is thermally conductive.

21. The stacked IC module of claim 13 in which a secondary portion of the flexible circuit is disposed between the first and second ICs.

22. The stacked IC module of claim 13 in which the first and second ICs are flash memory circuitry in leaded packages.

23. The stacked IC module of claim 13 in which the connective fields have contact areas which are in contact with the feet of the leads of a lower one of the first and second ICs in the stacked module.

24. The stacked IC module of claim 13 in which a secondary portion of the flexible circuit is disposed between the first and second ICs.

25. The stacked IC module of claim 13 in which there is a one-to-one correspondence between individual ones of the plural contact areas and pairs of leads of the first and second ICs, the pairs of leads being comprised of one lead from each of the first and second ICs.

26. The stacked IC module of claim 13 in which the first and second ICs are memory circuits in leaded packages.

27. The stacked IC module of claim 13 in which one of the first and second ICs is a microprocessor.

28. The stacked IC module of claim 13 in which the first and second ICs are dual die memory circuits in leaded packages.

29. A method for constructing a stacked IC module comprising the steps of:

providing a flex circuit that exhibits at least one connective field configured in an arcuate shape;

providing first and second leaded ICs, the first and second leaded ICs each having leads emergent from at least one side;

disposing together, the first and second ICs with the flex circuit between to deform the connective field to be conformal with the leads of the first and second leaded ICs to realize contact between selected contact areas of the at least one connective field and selected ones of the leads of the first and second ICs, so as to effectuate selective connections between the first and second ICs without employment of discrete distal ends of flexible circuit conductors in which the flex circuit exhibits two connective fields each of which includes plural contact areas and the flex circuit is comprised of at least two layers with a first of the two layers being comprised of copper and the second of the two layers being comprised of a dielectric.

30. The method of claim 29 in which the first and second ICs are each memory circuits in leaded packages.

31. The method of claim 30 in which the first and second ICs are each flash memory circuits in leaded packages.

32. The method of claim 29 comprising the further step of disposing an adhesive between at least one of the first and second ICs and the flex circuit.

33. The method of claim 29 in which the layer comprised of copper is disposed on the layer comprised of the dielectric.

* * * * *